US011282671B2

(12) United States Patent
Ikeda et al.

(10) Patent No.: US 11,282,671 B2
(45) Date of Patent: Mar. 22, 2022

(54) CHARGED-PARTICLE BEAM APPARATUS

(71) Applicant: Hitachi High-Technologies Corporation, Tokyo (JP)

(72) Inventors: Uki Ikeda, Tokyo (JP); Daisuke Bizen, Tokyo (JP); Makoto Sakakibara, Tokyo (JP); Makoto Suzuki, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/313,708

(22) PCT Filed: Jul. 28, 2016

(86) PCT No.: PCT/JP2016/072103
§ 371 (c)(1),
(2) Date: Dec. 27, 2018

(87) PCT Pub. No.: WO2018/020626
PCT Pub. Date: Feb. 1, 2018

(65) Prior Publication Data
US 2020/0185189 A1 Jun. 11, 2020

(51) Int. Cl.
*H01J 37/244* (2006.01)
*H01J 37/26* (2006.01)
(Continued)

(52) U.S. Cl.
CPC .......... *H01J 37/244* (2013.01); *H01J 37/261* (2013.01); *H01J 37/147* (2013.01); *H01J 37/20* (2013.01);
(Continued)

(58) Field of Classification Search
CPC .. H01J 37/244; H01J 37/261; H01J 2237/244; H01J 2237/2443; H01J 37/147;
(Continued)

(56) References Cited

U.S. PATENT DOCUMENTS 4,038,543 A * 7/1977 Krisch ................ H01J 37/09
250/307
4,099,055 A * 7/1978 Todokoro .............. H01J 37/224
250/311
(Continued)

FOREIGN PATENT DOCUMENTS

JP 62-110249 A 5/1987
JP 5054990 B2 10/2012
(Continued)

OTHER PUBLICATIONS

International Search Report (PCT/ISA/210) issued in PCT Application No. PCT/JP2016/072103 dated Nov. 15, 2016 with English translation (five (5) pages).
(Continued)

*Primary Examiner* — Wyatt A Stoffa
(74) *Attorney, Agent, or Firm* — Crowell & Moring LLP

(57) ABSTRACT

The purpose of the present invention is to provide a charged-particle beam apparatus capable of performing various types of signal discriminations according to the shape and the size of a sample. The present invention proposes a charged-particle beam apparatus for irradiating a sample disposed in a vacuum vessel with a charged particle beam. The charged-particle beam apparatus is provided with: a first light-generating surface for generating light on the basis of the collision of charged particles released from the sample; a light-guiding member for guiding the generated light to the outside of the vacuum vessel while maintaining the generation distribution of the light generated at the first light-generating surface; a photodetector for detecting the light guided by the light-guiding member to the outside of the vacuum vessel; and a light-transmission restricting member for restricting transmission of the light guided by the light-
(Continued)

guiding member between the photodetector and the light-guiding member.

11 Claims, 12 Drawing Sheets

(51) Int. Cl.
  *H01J 37/147* (2006.01)
  *H01J 37/20* (2006.01)
  *H01J 37/28* (2006.01)
(52) U.S. Cl.
  CPC .......... *H01J 37/28* (2013.01); *H01J 2237/16* (2013.01); *H01J 2237/2443* (2013.01); *H01J 2237/2817* (2013.01)
(58) Field of Classification Search
  CPC ........ H01J 37/20; H01J 37/28; H01J 2237/16; H01J 2237/2817; H01J 2237/281; H01J 2287/24495; H01J 37/265; H01J 2237/2448
  See application file for complete search history.

(56) References Cited

U.S. PATENT DOCUMENTS

| | | | | |
|---|---|---|---|---|
| 6,211,525 | B1* | 4/2001 | Cowham | H01J 37/244 250/397 |
| 7,705,302 | B2* | 4/2010 | Aoki | H01J 37/28 250/310 |
| 8,431,897 | B2* | 4/2013 | Shibata | H01J 37/244 250/311 |
| 9,159,529 | B2 | 10/2015 | Yamazaki et al. | |
| 2002/0190219 | A1* | 12/2002 | Mooney | G01T 1/20 250/397 |
| 2003/0019580 | A1* | 1/2003 | Strang | C23C 16/45589 156/345.33 |
| 2008/0191134 | A1* | 8/2008 | Almogy | H01J 37/244 250/307 |
| 2010/0032576 | A1* | 2/2010 | Mooney | H01J 37/244 250/368 |
| 2012/0187293 | A1* | 7/2012 | Shibata | H01J 37/244 250/310 |
| 2012/0273686 | A1* | 11/2012 | Kojima | B82Y 40/00 250/362 |
| 2012/0305766 | A1* | 12/2012 | Tanaka | H02K 41/031 250/310 |
| 2013/0234032 | A1* | 9/2013 | Wang | G01T 1/20 250/368 |
| 2014/0361167 | A1* | 12/2014 | Morishita | H01J 37/244 250/310 |
| 2015/0034824 | A1* | 2/2015 | Mori | H01J 37/28 250/310 |
| 2016/0011110 | A1* | 1/2016 | Kojima | H01J 37/244 250/458.1 |
| 2017/0032925 | A1* | 2/2017 | Sijbrandij | H01J 37/244 |

FOREIGN PATENT DOCUMENTS

| | | |
|---|---|---|
| JP | 2014-26834 A | 2/2014 |
| JP | 2015-106530 A | 6/2015 |
| JP | 5948084 B2 | 7/2016 |

OTHER PUBLICATIONS

Japanese-language Written Opinion (PCT/ISA/237) issued in PCT Application No. PCT/JP2016/072103 dated Nov. 15, 2016 (four (4) pages).

* cited by examiner

[FIG. 1]
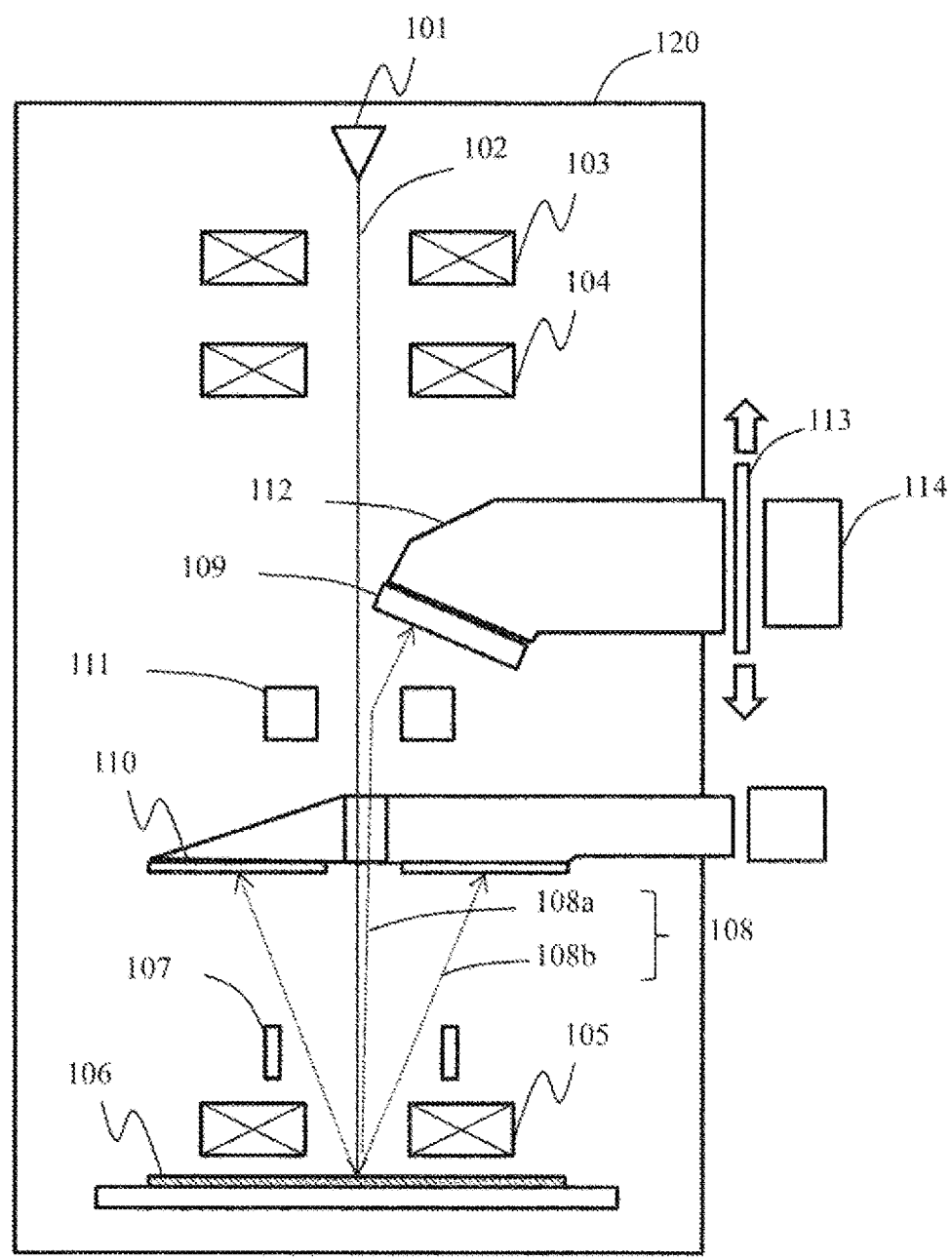

[FIG. 2]
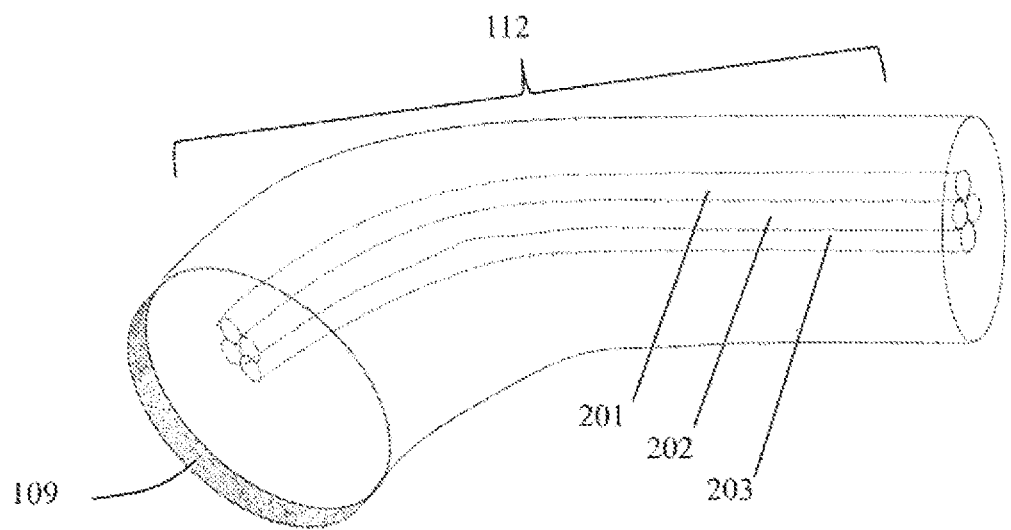

[FIG. 3]
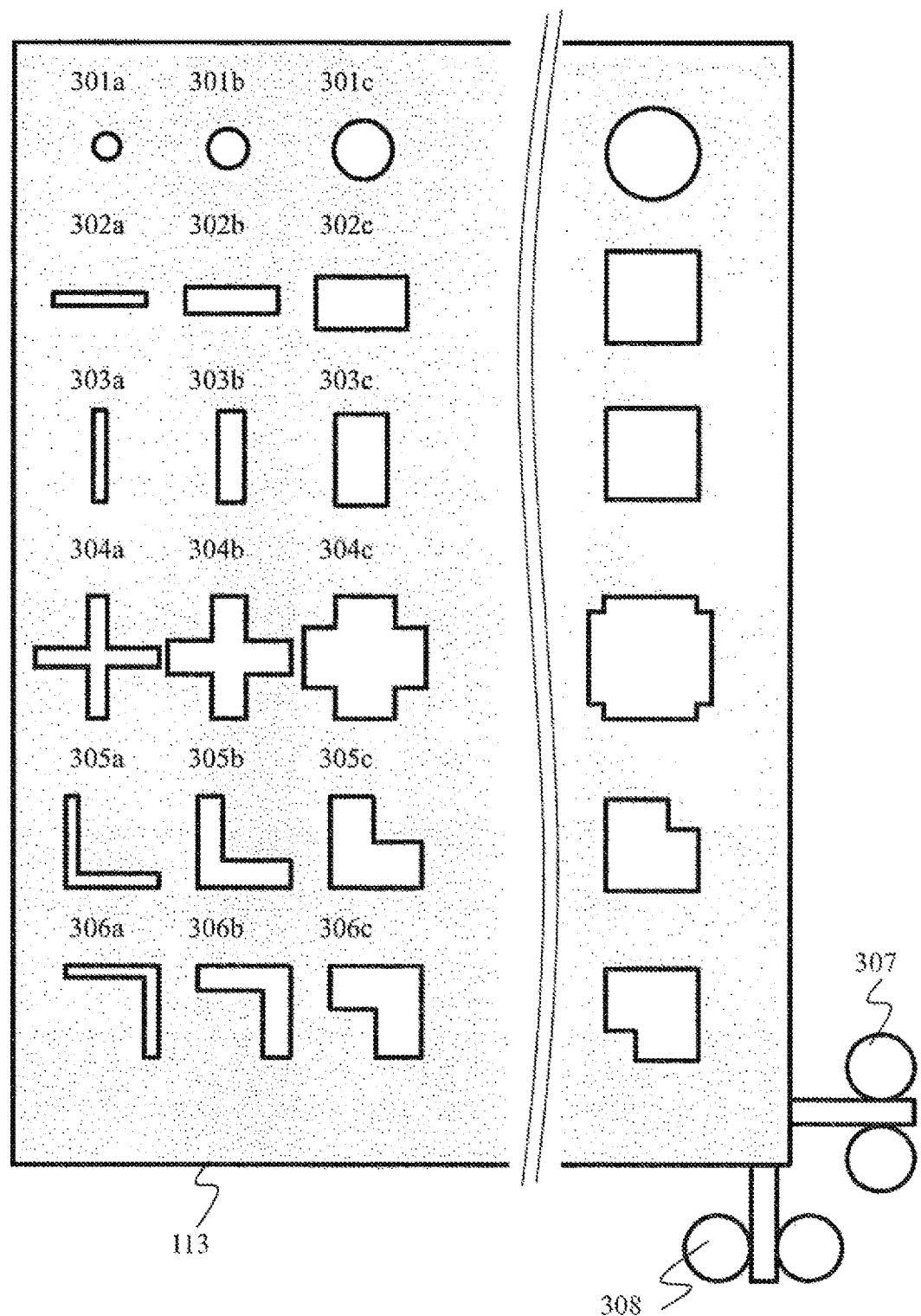

[FIG. 4]
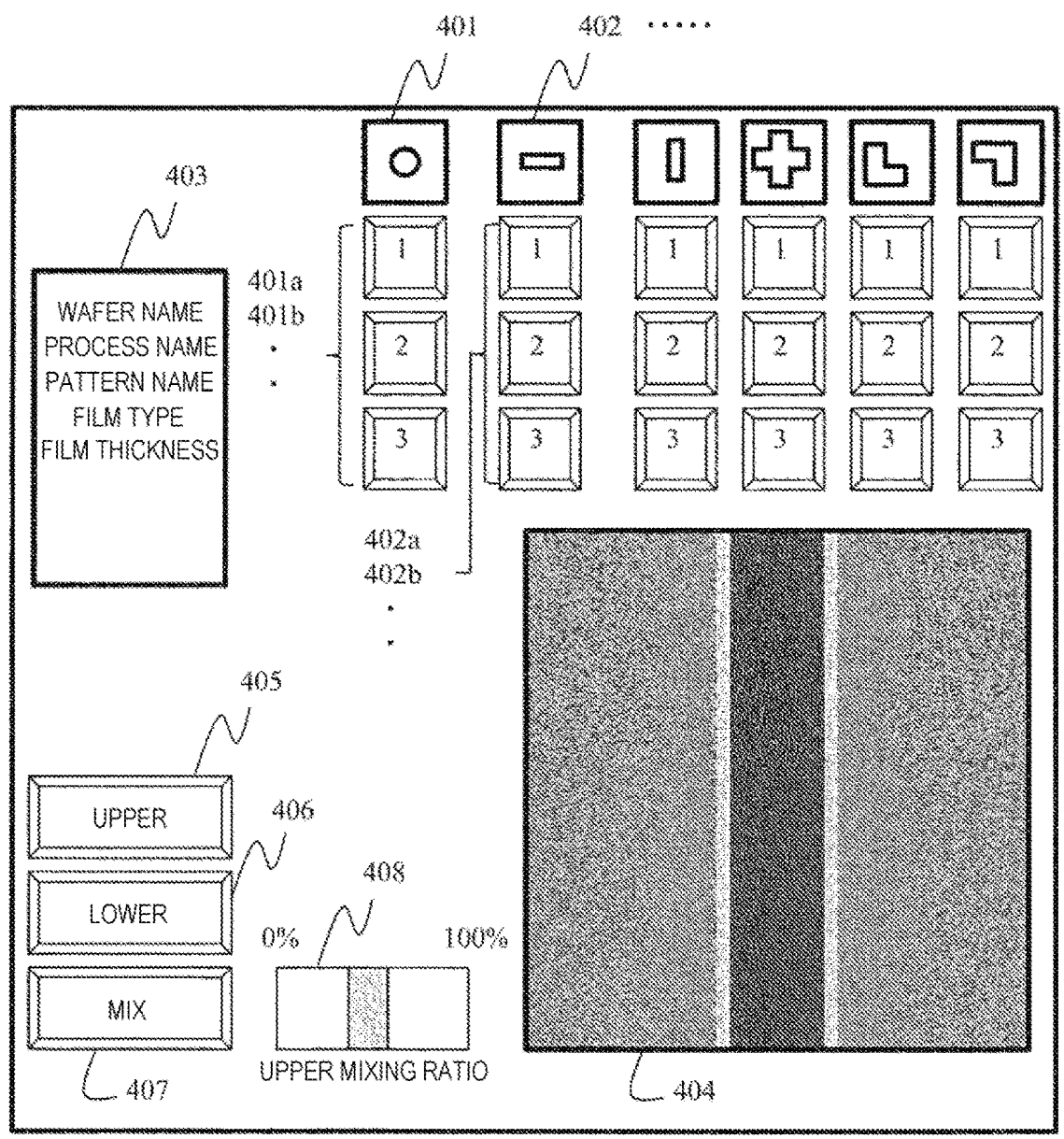

[FIG. 5]
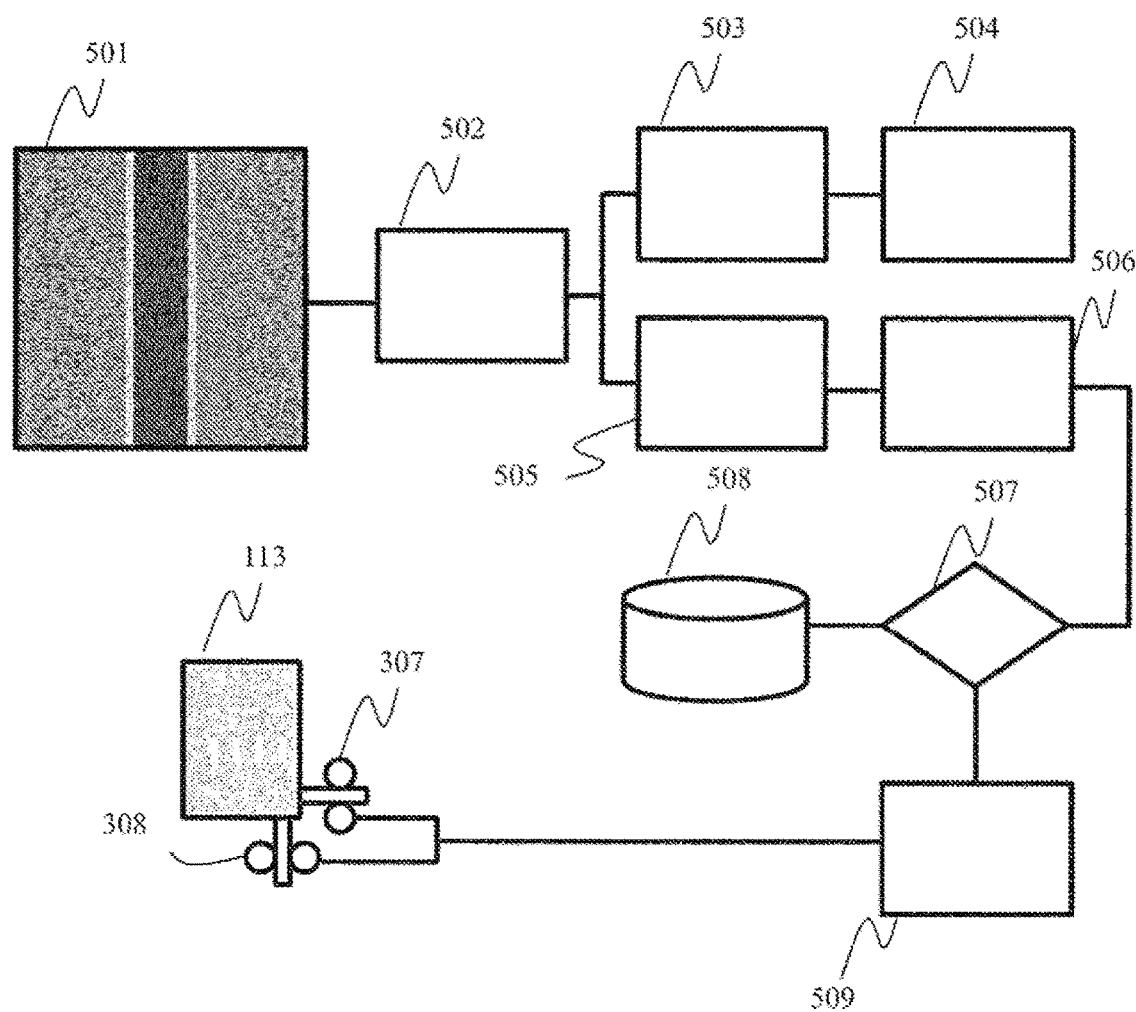

[FIG. 6]
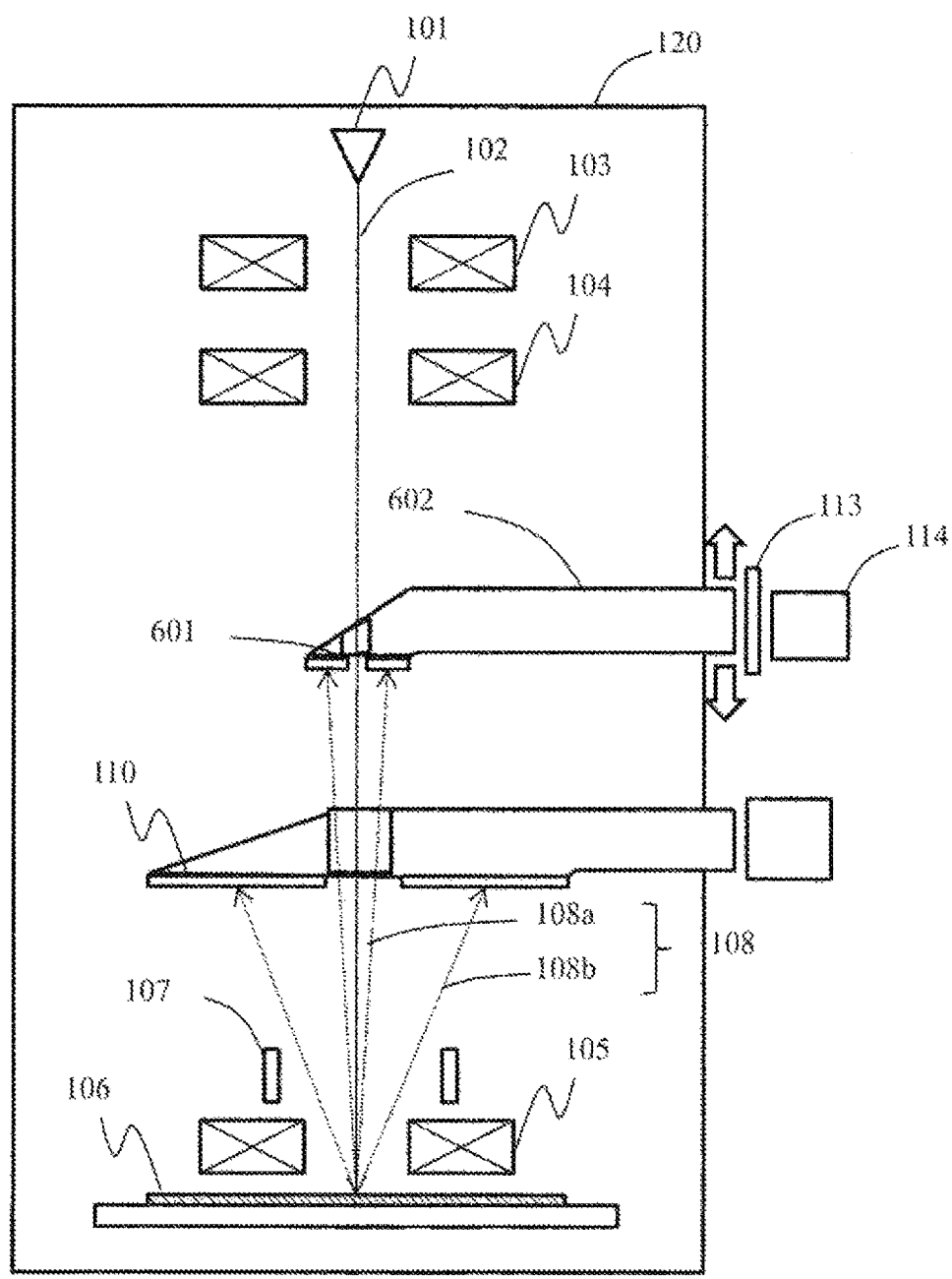

[FIG. 7]
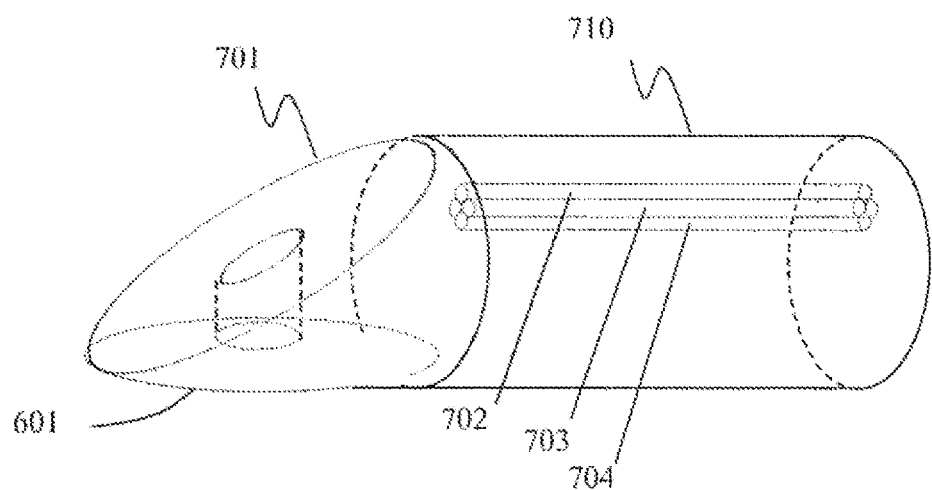

[FIG. 8]
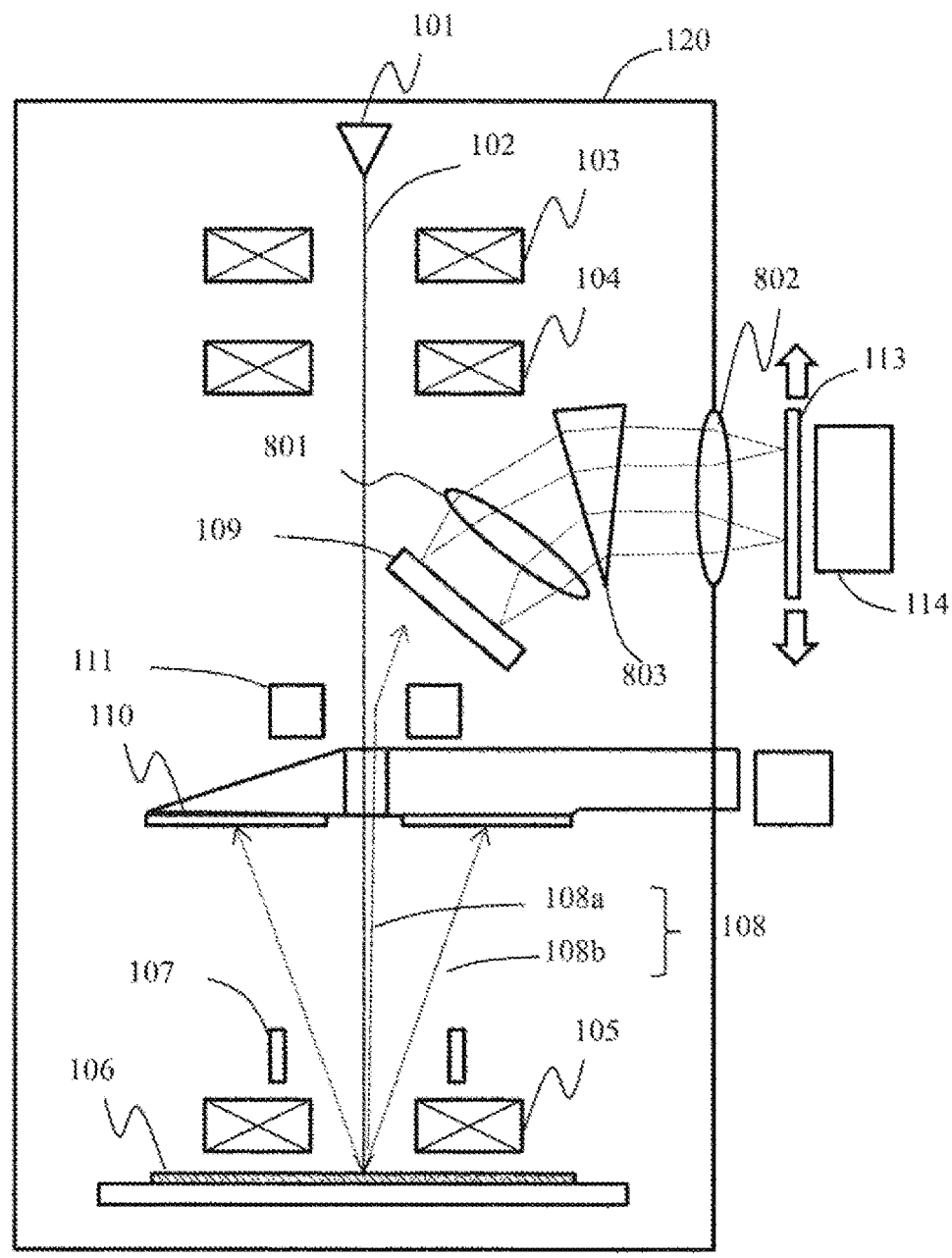

[FIG. 9]
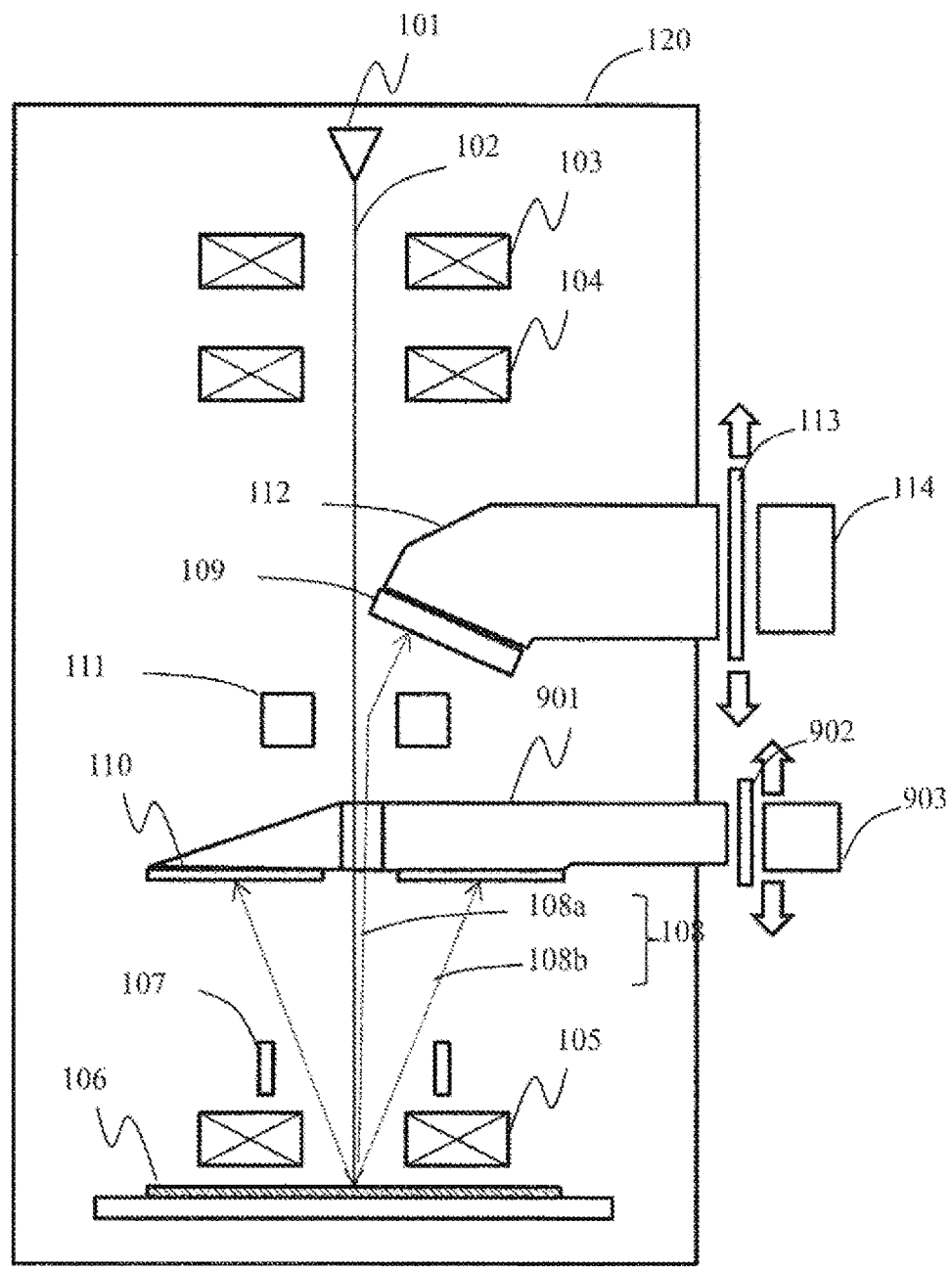

[FIG. 10]
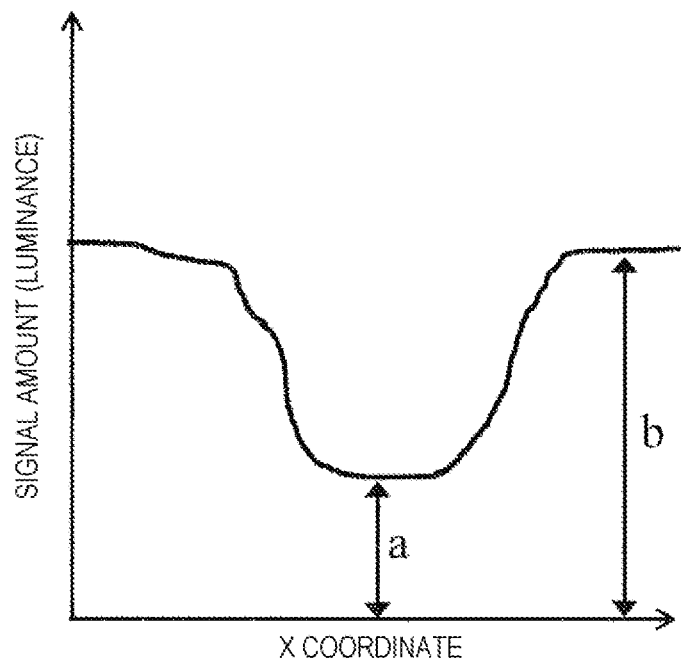
[FIG. 11]
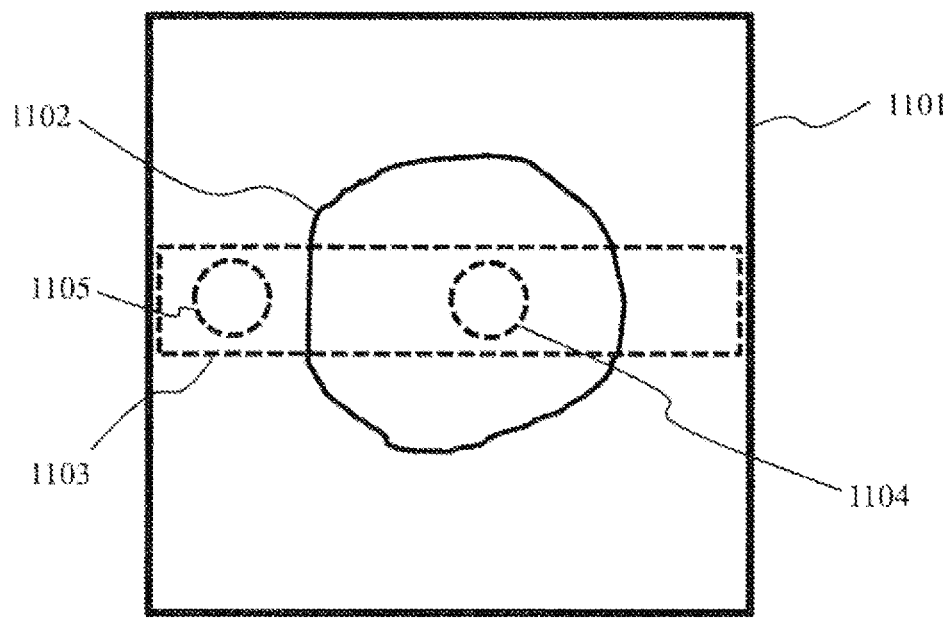

[FIG. 12]
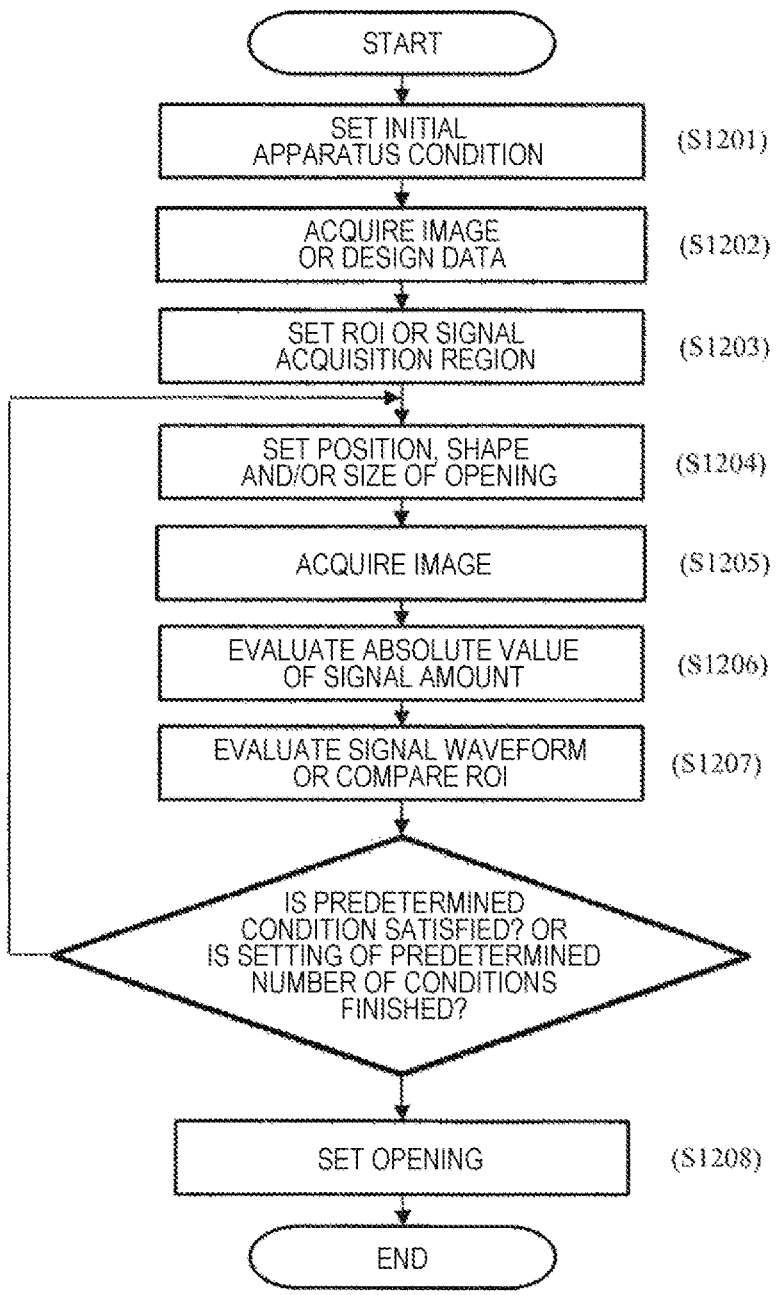

[FIG. 13]
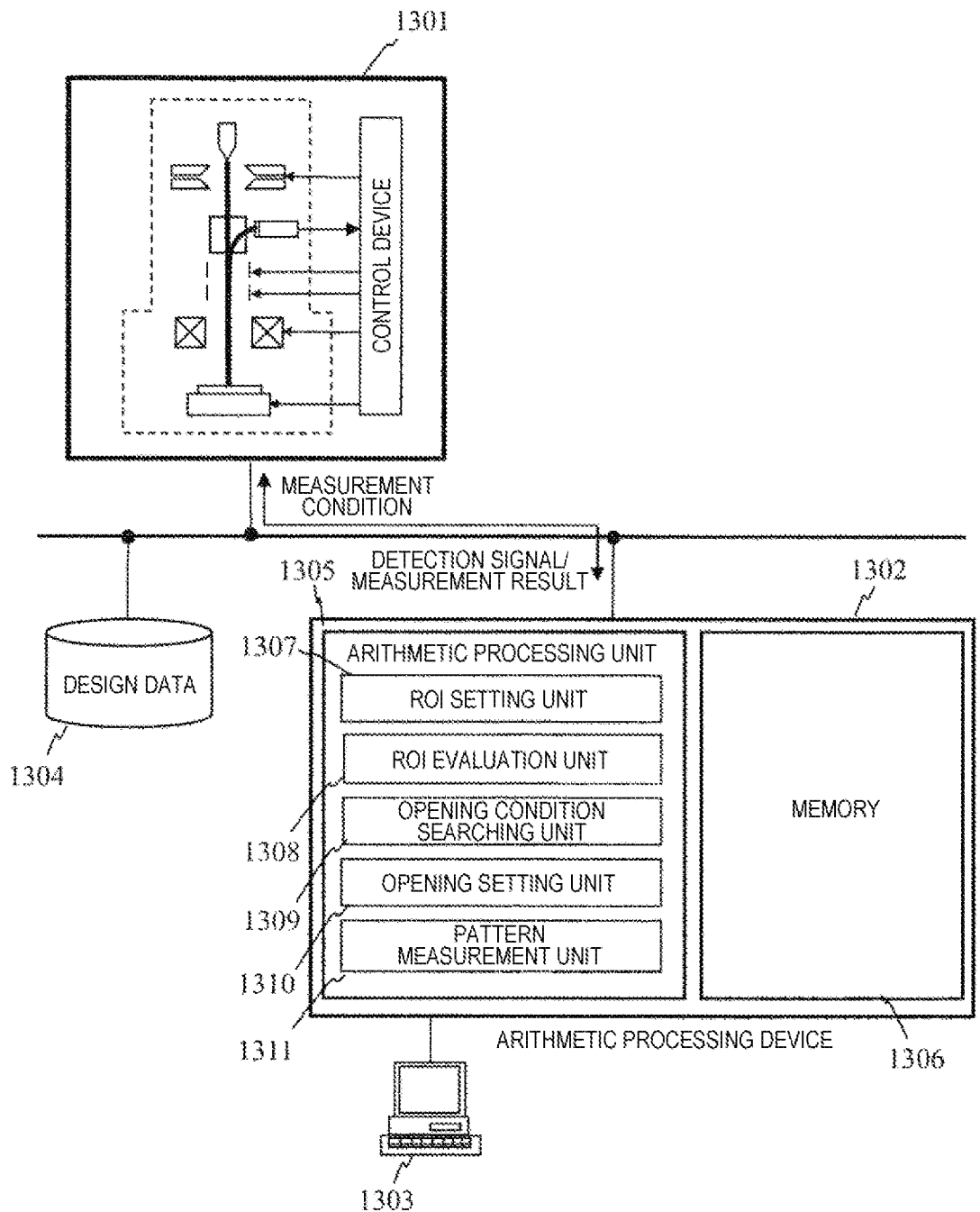

CHARGED-PARTICLE BEAM APPARATUS

TECHNICAL FIELD

The present disclosure relates to a charged-particle beam apparatus, and more particularly, to a charged-particle beam apparatus capable of selectively detecting charged particles that pass along a specific track.

BACKGROUND ART

A scanning electron microscope is one of apparatuses for detecting a signal obtained by scanning a charged particle beam released from a charged particle source on a sample. The scanning electron microscope detects signal electrons generated as a result of interaction of a primary electron beam with a sample when the primary electron beam is scanned on the sample and outputs a microscopic image based on an amount of the detected signal electrons. In particular, since it is possible to visualize the structure with resolving power of approximately nanometer without destroying the sample, the scanning electron microscope has been widely used for inspection and measurement of semiconductor devices which increase a degree of integration by miniaturizing the structure.

In recent years, together with the miniaturization of the semiconductor devices, the integration of semiconductor devices has been increasing due to three-dimensional structure. Such a semiconductor device has a complicated laminated structure. Therefore, not only the outermost surface of a laminated film but also a bottom portion of an extremely deep hole or groove formed in the laminated film is required to be clearly visualized. When compared to the electrons released from the surface of the sample, electrons released from the bottom of the hole or groove include electrons that collide with a side wall of the hole or groove, and thus, the detection efficiency is relatively low. In PTL 1, in order to perform track discrimination with respect to the electrons released in a direction perpendicular to the surface of the sample regardless of a deflection action of secondary electrons by a deflector for a field of view, a scanning electron microscope provided with a two-stage deflector for deflecting the secondary electrons corresponding to the deflection action of the deflector for moving the field of view is disclosed. Further, PTL 2 discloses a scanning electron microscope provided with a movable diaphragm. According to the scanning electron microscope disclosed in PTL 2, by adjusting a diameter of the movable diaphragm, a discrimination angle of the secondary electrons released from the sample can be adjusted.

CITATION LIST

Patent Literature

PTL 1: Japanese Patent No. 5948084 (corresponding U.S. Pat. No. 9,159,529)
PTL 2: Japanese Patent No. 5054990 (corresponding U.S. Pat. No. 7,705,302)

SUMMARY OF INVENTION

Technical Problem

According to the method disclosed in PTL 1, it is possible to discriminate electrons released from a hole bottom and released in a direction perpendicular to a sample surface with high accuracy from electrons released to other tracks, but the size of an opening is fixed, and thus, it is difficult to optimize the visibility of the hole and groove bottom according to various observation samples.

Meanwhile, PTL 2 discloses a diaphragm capable of adjusting a diameter of an opening, but it is difficult to provide a movable mechanism in a limited vacuum space. In addition, since it is necessary to dispose the movable mechanism in a limited space, it is considered that an adjustable range is also restricted. Further, it is considered that the movable mechanism causes dust generation and requires regular maintenance work. In addition, there is also a possibility that periodic maintenance work may also be a factor in lowering the operating efficiency of semiconductor device manufacturing lines where high continuous operation rates are required.

Hereinafter, a charged-particle beam apparatus for performing various types of signal discriminations according to the shape or the size of a sample is proposed.

Solution to Problem

According to an aspect for achieving the above-described object, hereinafter, there is provided a charged-particle beam apparatus for irradiating a sample disposed in a vacuum vessel with a charged particle beam released from a charged particle source, including: a first light-generating surface for generating light based on collision of charged particles released from the sample; a light-guiding member for guiding the generated light to the outside of the vacuum vessel while maintaining the generation distribution of the light generated on the first light-generating surface; a photodetector for detecting the light guided by the light-guiding member to the outside of the vacuum vessel; and a light-transmission restricting member for restricting transmission of the light guided by the light-guiding member between the photodetector and the light-guiding member.

Advantageous Effects of the Invention

According to the above-described configuration, it is possible to adjust a light transmission opening for track discrimination of signals outside the vacuum vessel, and as a result, it is possible to perform signal discrimination with high accuracy.

BRIEF DESCRIPTION OF DRAWINGS

FIG. 1 is a view illustrating an example of a scanning electron microscope.

FIG. 2 is a view illustrating an example of a light-guiding member attached to a detector.

FIG. 3 is a view illustrating an example of an opening plate having an opening for partially blocking light to be transmitted.

FIG. 4 is a view illustrating an example of a selection screen for selecting signal detection conditions.

FIG. 5 is a view illustrating an example of an opening plate control device.

FIG. 6 is a view illustrating an example of the scanning electron microscope including two ring-shaped detection units.

FIG. 7 is a view illustrating an example of the light-guiding member attached to the detector.

FIG. 8 is a view illustrating an example of the scanning electron microscope equipped with the detector having the light-guiding member including a lens and a prism.

FIG. 9 is a view illustrating an example of the scanning electron microscope including light-generating units and light-guiding members for guiding the light generated in the light-generating unit to the outside of the vacuum in two stages.

FIG. 10 is a view illustrating an example of a signal waveform obtained by beam scanning with respect to a hole pattern.

FIG. 11 is a view illustrating an example of an image obtained by beam scanning with respect to the hole pattern.

FIG. 12 is a flowchart illustrating a process of selecting a light transmission condition of the light-transmission restricting member.

FIG. 13 is a view illustrating an example of a measurement system including the scanning electron microscope.

DESCRIPTION OF EMBODIMENTS

In the embodiments to be described below, a scanning electron microscope including: a detection plate (light-generating unit) for detecting signal electrons generated from a sample and converting the signal electrons into photons; a light-guiding member for guiding light to the outside of a vacuum vessel while maintaining information of a signal electron reaching position on the detector; a photodetector for converting the light released from an end portion of the light-guiding member into an electric signal; and an opening plate for partially blocking the transmission of the light between the end portion of the light-guiding member and the photodetector will be described. Furthermore, it is desirable that the opening plate has at least two openings which are different in terms of shape or size, or are different in terms of shape and size. As a configuration of the light-guiding member, a member bundled with optical fibers may be used, or an optical system that forms an image of a luminescence image of detection electrons on the detection plate on the photodetector by using an optical lens, may be used. By providing a mechanism for appropriately switching the opening shape or the position of the opening plate disposed in front of the photodetector according to the observation sample, it is possible to arbitrarily select a release angle of signal electrons used for the microscopic image. Regarding how to select the opening shape, for example, a second detection plate is disposed in a lens barrel, a ratio of surface brightness and bottom portion brightness of the microscopic image obtained by the second detection plate is acquired, and an appropriate opening shape is set from a correspondence between a signal amount ratio and the opening shape that are registered in the apparatus in advance.

According to the above-described configuration, since it becomes possible to partially block a signal based on a mechanical control without having a movable portion in a vacuum, it is possible to ensure the reliability and operation rate of the apparatus, and to perform desired measurement or inspection without sacrificing a processing speed since other image capture elements, such as a CCD, are not used. In addition, by providing a plurality of opening shapes, it is possible to provide a scanning electron microscope in which the visibility of the hole and groove bottom is optimized according to various types of observation samples.

Example 1

First Example will be described with reference to FIGS. 1 to 5. FIG. 1 is a view illustrating an example of a scanning electron microscope. A primary electron beam 102 (electron beam) released from an electron source 101 is collimated by collimator lenses 103 and 104, and furthermore, is formed into a small spot on a sample 106 by an objective lens 105. The primary electron beam 102 scans an observation region by a deflector 107. Electrons 108 are released from the sample 106 by the scanning of the primary electron beam 102. The electrons 108 include secondary electrons (SE) and backscattered electrons (BSE). Further, the electrons 108 released from the sample 106 include an electron 108a released in a range where a relative angle to an optical axis of the beam is narrow and an electron 108b released in a range where the relative angle to the optical axis of the beam is relatively wide, and in the scanning electron microscope illustrated in FIG. 1, in order to discriminate the electrons released from the sample according to their release tracks, detection elements in the upper and lower two stages are provided.

An upper detection plate 109 and a lower detection plate 110 which are light-generating surfaces for generating the light by collision therewith of the electrons, are provided in each of the detection elements in the upper and lower two stages, and both detection plates are configured with a scintillator that generates the photons by the collision therewith of the electrons. The lower detection plate 110 is formed in a circular shape having a hole at the center. The light generated on the lower detection plate 110 is guided to a conversion element that converts the light into an electric signal by the light-guiding member, such as a light guide.

A Wien filter 111 that deflects the signal electrons while maintaining the optical axis of the primary electron beam is installed nearer to the electron source than the lower detection plate 110. A part (electron 108a) of the signal electrons are transmitted through a hole at the center of the lower detection plate 110, are separated from the optical axis of the primary electron beam by the Wien filter 111, and collide with the upper detection plate 109. Further, other signal electrons (electron 108b) collide with the lower detection plate 110.

When the signal electrons collide with the upper detection plate 109, the detection plate generates light, and photons generated at this time is guided to the outside of a vacuum vessel 120 via a light-guiding member 112. After this, the light extracted from an end portion of the light-guiding member 112 is transmitted through an opening plate 113 and then is detected by a photodetector 114. The photodetector 114 is a conversion element for converting the light into the electric signal. While one end (the side where the detection plate is attached) of the light-guiding member 112 is positioned in a vacuum chamber, the other end (the side facing the conversion element) of the light-guiding member 112 is positioned in the atmosphere. In other words, the light-guiding member is disposed to communicate between the vacuum space and the atmosphere. In addition, a vacuum sealing member is provided around the light-guiding member 112 in order to maintain the vacuum state of an electron beam passage in spite of the presence of the light-guiding member 112.

In addition, in the present Example, the lower detection plate 110 is described as a scintillator, but other charged particle detectors may be used as the lower detection plate. For example, a semiconductor detector or a microchannel plate (MCP) may be employed, or an indirect method for the detection in which a simple plate of metal, oxide, semiconductor or the like is installed and the secondary electrons generated by the collision of the charged particle beams are detected by a secondary electron detector disposed in the vicinity of the lower detection plate 110 may be employed.

FIG. 2 is a view illustrating the details of the light-guiding member 112 attached to a rear surface of the upper detection plate 109 in order to guide the light generated by the upper detection plate 109. The light-guiding member 112 is configured with a fiber bundle of finely divided optical fibers 201, 202, 203, . . . and guides the generated light caused by the collision of the signal electrons generated on the detection plate 109 to an exit of the fiber bundle. By using the fiber bundle, the distribution of light generation positions on the detection plate is projected to the exit part. In other words, the reaching positional information of the electron can be guided to the outside of the vacuum.

FIG. 3 is a view illustrating the details of the opening plate 113. A plurality of circular openings 301a, 301b, . . . having different diameters are formed in the opening plate 113. Furthermore, rectangular openings 302a, 302b, . . . , 303a, 303b, . . . having different orientations and widths are formed. In addition, cross-shaped openings 304a, 304b, . . . having different shapes are formed, and L-shaped openings 305a, 305b, . . . , 306a, 306b, . . . having different orientations and sizes are formed.

In addition, the shapes of the diaphragm disclosed in the present Example are merely examples, and it is not limited thereto. For example, openings having any shape, such as an ellipse or an orbicular zone, or any size may be used. The opening plate is connected to mechanical driving means 307 and 308 and is movable such that any opening is installed between the end portion of a fiber bundle 200 and a detection surface of the photodetector 114. As the mechanical driving means, any movable mechanism may be used as long as the movable mechanism is a generally known movable mechanism, such as a motor, a linear motor, a piezoelectric element, hydraulic, water pressure, and air cylinder, or the like that serves as an actuator. By combining the actuators with the movable mechanism, such as a gear, a belt, a ball screw, or a roller guide, it is possible to freely move the opening position. In addition, the combination of the opening plate having a plurality of openings and the mechanical driving means which are described in the Example may be an alternative means of providing the equivalent effect. For example, the opening plate provided with a hole of which the size can vary in a pupil shape by combining the plurality of blades, as represented by a shutter mechanism of a camera, may be moved by the mechanical driving means. Furthermore, alternatively, a method in which a liquid crystal panel is used as the opening plate so that the opening is realized with a part through which the light passes is also included. In this case, the size and the shape of the region through which light can pass can be changed by the orientation of liquid crystal molecules. In this case, it also becomes possible to change the position of the opening by the orientation of the liquid crystal molecules without using the mechanical driving means.

As described above, by providing an opening (light-transmission restricting member) of which at least one of the size and the shape is variable between the light-guiding member having the end portion outside the vacuum and the conversion element for converting the light into the electric signal, it becomes possible to perform advanced signal discrimination. More specifically, since the adjustment of the opening position or the adjustment of the size or the shape of the opening is possible in the atmosphere, when compared to the vacuum space, it becomes easy to employ a large opening plate having a large number of openings or a driving mechanism for the driving the opening plate, and it becomes possible to perform adjustment with high resolving power that can perform the track discrimination with high accuracy.

Next, a method for determining the shape of the opening by an operator of the scanning electron microscope will be described with reference to FIG. 4. FIG. 4 illustrates an operation screen of the scanning electron microscope. On the operation screen, simple views 401, 402, . . . illustrating the shapes of each of the openings of the opening plate 113 and buttons 401a, 401b, . . . , 402a, 402b, . . . for selecting the opening sizes of each shape are disposed.

In addition, a display unit 403 in which a wafer name, a process name, a pattern name, a film type, and a film thickness of the semiconductor device to be observed are described is installed. An image display region 404 is a display screen for displaying a microscopic image acquired by the scanning electron microscope. Selection buttons 405 to 407 for selecting which of the image by the upper detection plate 109, the image by the lower detection plate 110, or the image obtained by mixing both of the upper detection plate 109 and the lower detection plate 110 is displayed as the microscopic image displayed on the display screen, and a bar 408 for setting a mixing ratio when mixing the detection signals by the upper detection plate and the lower detection plate are installed. The operator determines the type of the opening from the characteristics of the observation target illustrated in the display unit 403, selects any of the selection buttons 402a, 402b, . . . , and performs examination and measurement. Alternatively, by selecting the upper detection plate with the button 406 and switching the selection buttons 402a, 402b, while watching the microscopic image displayed on the image display region 404, the type of the opening that gives the most appropriate microscopic image is determined. Alternatively, the lower detection plate is selected with the button 406 and an appropriate type of the opening from the shape of an observation target and the direction on the screen is determined.

Next, a method for automatically determining the type and the size of the opening will be described with reference to FIG. 5. FIG. 5 illustrates a microscopic image 501 generated from the signal electrons detected by the lower detection plate 110. Since the image influenced by the opening selected at this point of time is an image of the upper detection plate 109, the microscopic image by the lower detection plate illustrated here is an image not selected by the opening. Here, as an example, it is assumed that an observation sample has a linear groove shape. Essential differences do not occur in the method of implementation even in other shapes (hole, cross, L shape, and the like).

First, the microscopic image 501 is transferred to an image processing unit 502. After this, a first image calculation unit 503 determines whether the observation sample has a hole shape, a straight groove shape, a cross shape, or an L shape, using a general pattern recognition method. Various known methods can be used for the pattern recognition, but since the electron microscopic image contains noise, it is desirable to perform shape recognition after contouring the edge of the pattern. The result of the pattern recognition in the first image calculation unit 503 is transferred to an opening control unit 504 as the shape of the determined observation sample. The opening control unit 504 selects the opening shape same as the observation sample shape or based on previously stored condition.

After the above-described processing, the microscopic image 501 is transferred from the image processing unit 502 to a second image calculation unit 505. The second image processing unit 505 calculates a luminance S1 of a surface portion and a luminance S2 of a bottom portion based on the sample shape determined by the first image calculation unit 503. After this, a ratio R of S1 and S2 is calculated by a luminance calculation unit 506. Several numerical ranges [MIN 1, MAX 1], [MIN 2, MAX 2], [MIN 3, MAX 3], [MIN 4, MAX 4], . . . are stored in advance in a storage device 508. The numerical ranges do not overlap with each other, and are prepared so that R calculated by the luminance calculation unit 506 is necessarily included in any one of the numerical ranges.

Each numerical range and the size of the opening are associated with each other in advance. A luminance comparison unit 507 selects a numerical range including R calculated by the luminance calculation unit 506. The opening size is determined by a predetermined correspondence according to which numerical range is the corresponding numerical range including R. For example, the numerical value column and the size of the opening are associated with each other so that an opening having a smaller size is selected as R becomes less. The determined type of the opening is transferred to an opening control unit 509, and the opening control unit 509 (control device) operates the driving means 307 and 308 and switches the opening plate 113.

According to the above-described configuration, it is possible to perform condition setting that can acquire an image in which a pattern part to be measured or examined has been emphasized in comparison with other parts. Further, since the opening adjustment can be performed on the atmosphere side, it is possible to perform the condition setting with high accuracy compared to a case where the opening adjustment is performed in a vacuum.

FIG. 13 is a view illustrating an example of a measurement system including a scanning electron microscope (SEM 1301) and an arithmetic processing device 1302 for setting SEM apparatus conditions. The SEM 1301 is provided with a light guide having a detection plate which is a light-generating element as illustrated in FIG. 1 at one end thereof, and the light guide is configured as illustrated in FIG. 2, and guides the light to the outside of the vacuum chamber by the light-guiding member that corresponds to the reaching position of the electrons on the detection plate. The atmosphere side end portion of the light guide is equipped with the photodetector, and the opening plate as illustrated in FIG. 3 is installed between the light guide atmosphere side end portion and the photodetector, and is configured so that at least one of the position, the size, the shape, and the direction of the opening can be adjusted.

The arithmetic processing device 1302 measures or inspects the pattern formed on the sample by setting the SEM apparatus conditions (measurement conditions) or processing the signals obtained by the SEM. More specifically, the arithmetic processing device 1302 supplies a control signal including the measurement condition to the SEM 1301, and an arithmetic processing unit 1305 that executes the processing related to the pattern measurement based on the detection signal or the measurement result obtained by the SEM 1301, or a memory 1306 for storing a recipe which is an operation program for determining the measurement conditions or the processing conditions, or the measurement results and the like, are embedded. The detection signal obtained by the SEM 1301 is supplied to image processing hardware, such as a CPU, an ASIC, or an FPGA, incorporated in the arithmetic processing device 1302, and the image processing or the calculation that corresponds to the purpose is performed.

In the arithmetic processing unit 1305, an ROI setting unit 1307 for setting a region of interest (ROI) on an image, an ROI evaluation unit 1308 for evaluating a signal obtained by the ROI, an opening condition searching unit 1309 for searching the condition of the opening based on the set conditions, an opening setting unit 1310 for selecting an appropriate opening based on the ROI information obtained by the ROI evaluation unit 1308 from among the openings having the predetermined condition searched by the opening condition searching unit 1309, and a pattern measurement unit 1311 for executing the pattern measurement or inspection based on the obtained detection signal, are provided.

FIG. 12 is a flowchart illustrating a process of selecting an appropriate opening based on the obtained image or the pattern information obtained from a design data storage medium 1304. In the memory 1306, as a measurement recipe, a program for automatically or semi-automatically executing the processing illustrated in FIG. 12 is stored. First, in order to acquire the image of the sample to be measured, the apparatus condition of the SEM 1301 is set, and an image is acquired based on the beam scanning to the region including the pattern to be measured (steps 1201 and 1202). The image acquisition is performed in order to specify the shape, the size, the orientation (direction), and the like of the pattern, but in a case where the pattern information is determined in advance by referring to the design data stored in the design data storage medium 1304, the image acquisition processing using the SEM can be omitted.

Next, ROI and the like are set on the obtained image or the design data (step 1203). The ROI setting is performed by the ROI setting unit 1307 based on the setting of the input device 1307 and is used for selecting an appropriate opening. For example, in a case of a hole pattern 1102 displayed in an image 1101 illustrated in FIG. 11, there is the need to see the bottom of the hole. By setting the conditions such that the ratio (a/b) of both signal amounts increases when a signal amount of the hole bottom is 'a' and a signal amount other than the hole bottom portion is 'b', it is possible to make the image in which the hole bottom is emphasized. In a case of the hole pattern illustrated in FIG. 11, while the electrons that collide with a side wall of the hole among the electrons released from the hole bottom cannot escape from the hole bottom, the electrons released from the surface of the sample can reach the detector even when electrons are released in a direction in which electrons if from the hole bottom collide with the side wall and cannot escape therefrom, and thus, by restricting the detection of the electrons released in such a direction, compared to other cases, it is possible to generate an image in which the hole bottom is emphasized. Meanwhile, since the appropriate restriction angle also varies depending on the depth of the hole, an ROI 1103 is set so as to straddle the hole bottom and the surface of the sample as illustrated in FIG. 11, and as a signal waveform 1001 illustrated in FIG. 10 is generated by the ROI evaluation unit 1308, the ratio (a/b) of the signal amount a of the hole bottom and the signal amount b of the sample surface is obtained, and the apparatus conditions are set so as to maximize the value or to satisfy the predetermined condition. Alternatively, the apparatus conditions are set based on the setting of the individual ROIs 1104 and 1105 for the hole bottom and the surface of the sample, respectively. In addition, the signal waveform of FIG. 10 is generated based on the detection of the backscattered electrons.

In a case of the hole pattern illustrated in FIG. 11, it is considered that the releasing range of the electrons released from the hole bottom has a conical shape having a conical surface that is in contact with a contour portion of the hole exit with the hole bottom center as an apex, and thus, it is preferable to prepare a plurality of circular openings, to select the size that makes it possible to emphasize the hole bottom from among the openings, and to restrict the signal.

The opening condition searching unit 1308 specifies the pattern shape and selects the opening to be evaluated based on the acquired image or the design data (step 1204). As described above, in a case of the circular hole pattern, it is considered desirable that signal restriction is performed by the circular opening, and thus, in step 1204, circular openings having a plurality of sizes are selected. In step 1205, one of the plurality of selected openings is set as the apparatus condition, and in this state, image generation based on beam scanning is performed. Next, for example, the signal amount of the hole bottom or the like is obtained, and at the same time the set openings are evaluated by evaluating the signal waveforms or comparing the ROIs (steps 1206 and 1207). In the opening setting unit 1309, the opening selected in step 1204 is selected, or an appropriate opening is selected by repeating until a predetermined condition is satisfied (step 1208). For the selection of the opening, for example, an opening of which an absolute amount of the signals of the hole bottom is equal to or greater than a predetermined value and the (a/b) is the maximum or equal to or greater than the predetermined value, may be selected.

In addition, in the above-described example, the shape of the pattern is specified by referring to the image acquisition or the design data, and the shape of the opening is selected in accordance with the pattern shape, but in a case where an appropriate shape is not determined, the determination of step 1204 to step 1207 may be performed while changing not only the size but also the shape, the position, the direction and the like. Further, the size of the opening may be selected according to the depth of the hole or the like. For example, the depth of the pattern and the appropriate size of the opening may be stored in association with each other, and an opening having an appropriate size may be selected based on the input of the depth of the pattern.

Further, in a case of generating an image in which the bottom of the groove is emphasized, the rectangular opening 302 or 303 may be selected and an opening having an appropriate size among the openings may be selected. Furthermore, in a case where an image in which the side wall of the groove is emphasized rather than the bottom of the groove is generated, by changing not only the size (width) of the opening but also the position of the opening so as to correspond to the variation of the inclination angle of the side wall, the size and the position of an appropriate opening may be found out. In addition, the opening plate 113 illustrated in FIG. 3 is provided with openings (for example, openings 302a and 303a) having the same shape and the same size in different directions, but a rotating mechanism for rotating the opening plate 113 may be provided, so that the direction of the opening can be changed. Furthermore, by evaluating the ratio of the luminance of the hole bottom and the luminance of the surface of the sample while changing the position of the circular opening, in a case where the hole pattern is formed to be inclined, it is possible to evaluate the degree of the inclination.

As described above, the pattern measurement unit 1311 executes the pattern measurement by using the image signal or the waveform signal in which the information at a specific part is emphasized. By providing the opening for the track discrimination of the electrons on the atmosphere side as described above, it is possible to accurately adjust the size, the shape, the position, the direction, and the like of the opening, and as a result, based on the advanced track discrimination, it is possible to obtain a signal that emphasizes specific information.

Example 2

As Second Example, another method for automatically determining the size of the opening will be described. In the Example, the numerical ranges [MIN 1, MAX 1], [MIN 2, MAX 2], [MIN 3, MAX 3], [MIN 4, MAX 4], . . . stored in the storage device 508 are stored being separately for each type and thickness of films input into the display unit 403. By doing so, it becomes possible to automatically change the size of the opening not only by R calculated by the luminance calculation unit 506, but also by the type and the thickness of the film. Similarly, since the depth of the observation structure from the numerical value of the film thickness is known and the width of the observation structure from the image by the lower detection plate 110 is known, it is possible to calculate an aspect ratio of the observation structure (hole, groove, and the like) from the ratio of the depth and the width. Therefore, it also becomes possible to associate the aspect ratio with the numerical ranges [MIN 1, MAX 1], [MIN 2, MAX 2], [MIN 3, MAX 3], [MIN 4, MAX 4], . . . stored in the storage device 508, and it becomes possible to automatically change the size of the opening according to the aspect ratio.

Example 3

As Third Example, in the scanning electron microscope similar to First Example, a method for stably acquiring the image regardless of the observation position of the sample will be described. The deflector 107 illustrated in FIG. 1 is used for scanning the electron beam, but also changes the track of the electrons released from the sample. In addition, the track of the electrons released from the sample also changes by moving the field of view by the deflector for moving the field of view (image shift deflector) (not illustrated). Here, in the Example, an example in which the opening plate 113 is moved according to the deflection signal (deflection amount and direction) of the deflector 107 or the deflector for moving the field of view will be described. More specifically, by using the mechanical driving means 307 (driving mechanism) for moving the position of the opening plate 113, by controlling the position of the opening plate 113 in conjunction with a change in the track of the electrons released from the sample, the track discrimination condition is maintained to be constant regardless of the deflection signal. In a case where a liquid crystal panel is used as the opening plate 113, it is possible to change the position of the opening by the orientation of the liquid crystal molecules without using the mechanical driving means.

According to the method of the present Example, it becomes possible to maintain the track discrimination condition with high accuracy regardless of the deflection signal.

Example 4

As Fourth Example, a scanning electron microscope having a configuration different from that of FIG. 1 will be described. FIG. 6 is a view illustrating a configuration of the scanning electron microscope. Differences from First Example are that a ring-shaped detection plate 601 having a hole at the center is used as the upper detection plate, and that the shape of a light-guiding member 602 is different from the light-guiding member 112 in FIG. 1. In a case of the ring-shaped detection plate, the primary electron beam 102 is transmitted through the hole at the center, and thus, the Wien filter 111 used in Example 1 is unnecessary.

FIG. 7 is a view illustrating the details of the light-guiding member 602 adopted in Fourth Example. A prism 701 is provided for guiding the light generated by the ring-shaped detection plate 601 to the outside of the vacuum chamber while maintaining the generation distribution information thereof. The light-guiding member is configured with a fiber bundle 710 that guides the electrons reflected by the prism 701 and bundles finely divided optical fibers 702, 703, 704, . . . , and the light generated by the collision of the signal electrons generated on the detection plate 601 is guided to the exit of the fiber bundle. By using the fiber bundle, the distribution of light generation positions on the detection plate is projected to the exit part.

By partially restricting the transmission of the projected image using the opening plate 113 provided outside the vacuum chamber, it becomes possible to obtain a signal that emphasizes the specific information.

Example 5

As Fifth Example, another example of the light-guiding member for guiding the light generated in the vacuum chamber to the atmosphere side will be described. FIG. 8 is a view illustrating an example of the scanning electron microscope having the light-guiding member including two lenses 801 and 802 and a prism 803. The lenses 801 and 802 and the prism 803 are disposed behind the upper detection plate 109 (the side opposite to the surface where the electrons collide), and the distribution of the light generation positions on the detection plate 109 is projected on the detection surface 308 of the photodetector 114. In addition, the number of lenses and the number of prisms and the positional relationship therebetween are not limited to those in FIG. 8. For example, when it is not necessary to bend the optical path and the light is extracted linearly, the prism 803 is unnecessary. By partially restricting the transmission of the projected image using the opening plate 113 provided outside the vacuum chamber, it becomes possible to obtain a signal that emphasizes the specific information.

Example 6

FIG. 9 illustrates Sixth Example. In the Example, a light-guiding member 901 equivalent to that illustrated in FIG. 7 is disposed on the lower detection plate 110. When the signal electrons collide with the lower detection plate 110, the detection plate generates the light, and the photons generated at this time are guided to the outside of the vacuum vessel 120 via the second light-guiding member 901. After this, the photons extracted from the end portion of the second light-guiding member 901 are transmitted through the second opening plate 902, and then are detected by the second photodetector 903.

According to the configuration illustrated in FIG. 9, it becomes possible to obtain a signal that emphasizes desired specific information from among the electrons released over a wide range.

REFERENCE SIGNS LIST

101: electron source
102: primary electron beam
103: collimator lens
104: collimator lens
105: objective lens
106: sample
107: deflector
108: electron
109: upper detection plate
110: lower detection plate
111: Wien filter
112: light-guiding member
113: opening plate
114: photodetector
120: vacuum vessel

The invention claimed is:

1. A charged-particle beam apparatus for irradiating a sample disposed in a vacuum vessel with a charged particle beam released from a charged particle source, comprising:
    a scanning deflector for scanning the charged particle beam on the sample;
    a first light-generating surface for generating light based on a collision of charged particles released from a sample surface on a side of the charged particle source;
    a light-guiding member for guiding the generated light to the outside of the vacuum vessel while maintaining the generation distribution of the light generated on the first light-generating surface;
    a photodetector for detecting the light guided by the light-guiding member to the outside of the vacuum vessel; and
    a light-transmission restricting member for restricting transmission of the light guided by the light-guiding member between the photodetector and the light-guiding member; and
    a control device for controlling at least one of a size, a position, a shape, and a direction of a light transmission opening of the light-transmission restricting member;
    wherein the control device adjusts at least one of the size, the position, the shape, and the direction of the light transmission opening such that a ratio of a signal of a first part on the sample and a signal of a second part different from the first part satisfies a predetermined condition, the ratio being obtained based on the scanning of the charged particle beam.

2. The charged-particle beam apparatus of claim 1, wherein
    the light-transmission restricting member is an opening plate having two or more openings which are different from each other in terms of at least one of the size, the position, the shape, and the direction, and includes a driving mechanism for driving the opening plate.

3. The charged-particle beam apparatus of claim 1, wherein
    the light-transmission restricting member is configured with a combination of a plurality of blades and is configured such that the size of the opening can be adjusted by adjusting the plurality of blades.

4. The charged-particle beam apparatus of claim 1, wherein
    the light-transmission restricting member is a liquid crystal plate and is configured such that at least one of the size, the position, the shape, and the direction of an opening through which the light is transmitted is variable by switching a liquid crystal orientation.

5. The charged-particle beam apparatus of claim 1, wherein
    the light-guiding member is configured with an optical fiber bundle.

6. The charged-particle beam apparatus of claim 1, wherein
the light-guiding member includes an optical lens which allows the light at each position of the light-generating surface to be projected onto the photodetector.

7. The charged-particle beam apparatus of claim 1, wherein
the first light-generating surface is disposed outside an axis of the charged particle beam, and the charged-particle beam apparatus includes a deflector for deflecting charged particles released from a sample toward the first light-generating surface disposed outside of the axis of the charged particle beam.

8. The charged-particle beam apparatus of claim 7, further comprising:
a second light-generating surface for generating the light nearer to the sample than the deflector, based on the collision of the charged particles released from the sample.

9. The charged-particle beam apparatus of claim 8, wherein
the second light-generating surface has a shape of a ring, and the charged particle beam is transmitted through a hole of the shape of a ring.

10. The charged-particle beam apparatus of claim 1, wherein
the control device adjusts at least one of the size, the position, the shape, and the direction of the light transmission opening such that the ratio of the signal of the first part and the signal of the second part becomes equal to or greater than a predetermined value or becomes the maximum value.

11. A method for irradiating a sample disposed in a vacuum vessel with a charged particle beam released from a charged particle source, the method comprising:
irradiating the sample with the charged particle beam via a scanning deflector;
generating light from a first light-generating surface based on a collision of charged particles released from a sample surface on a side of the charged particle source;
guiding the light to outside of the vacuum vessel by a light-guiding member while maintaining a generation distribution of the light generated from the first light-generating surface;
detecting, by a photodetector, the light guided by the light-guiding member to the outside of the vacuum vessel;
restricting transmission of the light guided by the light-guiding member between the photodetector and the light-guiding member by a light-transmission restricting member; and
adjusting at least one of a size, a position, a shape, and a direction of a light transmission opening of the light-transmission restricting member such that a ratio of a signal of a first part on the sample and a signal of a second part different from the first part satisfies a predetermined condition, the ratio being obtained based on scanning of the charged particle beam.

* * * * *